Oct. 12, 1965 R. BARRASS ETAL 3,212,003

AUTOMATIC ATTENUATOR CONTROL DIODE CIRCUIT FOR OPERATING A PEAK METER

Filed Feb. 8, 1961

Inventors
R. Barrass
G. M. Edge
By Holcomb, Wetherill & Brisebois
Attorneys

United States Patent Office 3,212,003
Patented Oct. 12, 1965

3,212,003

AUTOMATIC ATTENUATOR CONTROL DIODE CIRCUIT FOR OPERATING A PEAK METER

Robert Barrass and Gordon Malcolm Edge, Cambridge, England, assignors to Pye Limited, Cambridge, England, a British company Filed Feb. 8, 1961, Ser. No. 87,842
Claims priority, application Great Britain, Feb. 15, 1960, 5,304/60
6 Claims. (Cl. 324—119)

The present invention relates to circuit arrangements for controlling the amplitude of signals, more particularly audio signals and video signals.

The invention consists in a circuit arrangement for controlling the amplitude of a signal fed over a pair of conductors, comprising a separate diode device connected in series with each conductor and biased to conduct when no signal is applied thereto and means for varying the bias applied to both diode devices so as to alter their conductance and hence their impedance to a signal fed over the conductors through the diode devices. The diode devices preferably comprise two semiconductor junction diodes. The circuit should be designed so that its D.C. resistance and A.C. impedance is low with respect to the impedance of the diode devices so that variation of their impedance by variation in the bias has substantial effect upon the amplitude of an applied signal.

According to a feature of the invention, the output electrodes of the diode devices are connected to opposite ends of a centre-tapped transformer winding and the variable bias is applied to this centre tap. The input electrodes of the diode devices may also be connected to opposite ends of a further centre-tapped winding on another transformer, to the centre tap of which a potential is applied in relation to the bias so as to render the diodes conducting in the no signal condition.

According to a preferred form of the invention, the bias is derived from a source having a low source impedance. This low source impedance may pe ensured by a transistor arrangement connected to the bias source.

A circuit arrangement according to the present invention may be used for the automatic amplitude expansion or compression of a signal. In such an arrangement, the bias applied to the diode devices is made to vary automatically in accordance with variations in amplitude of the applied signal.

In order that the invention may be more readily understood, reference will now be made to the accompanying drawings in which.

Figure 1:
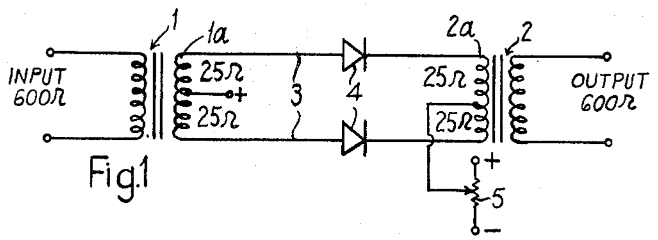
FIGURE 1 shows a circuit according to one embodiment of the present invention which may be employed as a manually-operated fader.

Referring to FIGURE 1, the fader circuit comprises two transformers 1 and 2 each having a low impedance centre-tapped winding, *1a* and *2a* respectively, these windings being connected together by two conductors 3. Connected in series with each conductor 3 is a semiconductor junction diode 4, these diodes being connected with the same polarity. The centre tap of the low impedance winding *1a* of the transformer 1 is connected to the positive pole of a low voltage D.C. supply, for example 12 volts, and the centre tap of the low impedance winding *2a* of the transformer 2 is connected to the slider of a potentiometer 5 connected between the positive and negative poles of the D.C. supply. The adjustment of this slider controls the bias supplied to the diodes.

When the control bias to the diodes 4 is increased, by moving the slider of the potentiometer 5 towards the negative pole of the D.C. supply, the mean current through the two diodes is increased and therefore their impedance is decreased, whereby the signal output which is derived from the secondary winding of the transformer 2 is less attenuated. On the other hand, as the control bias is decreased by moving the slider of the potentiometer 5 towards the positive pole of the D.C. supply, the mean current through the two diodes decreases and therefore their impedance increases and the attenuation of the output signal from the transformer 2 is increased. The useful limit of control is reached when the level of the signal approaches the noise level. Preferably the portion of the diode characteristic which is used is that which results in a logarithmic change of signal output for a linear change of bias, thereby enabling a linear potentiometer to be used.

The circuit is designed so that the D.C. resistance and A.C. impedance presented to the diodes 4 is small in order to avoid blanketing or swamping the resistance effect of diodes 4. The input signal to the diodes 4 should also be low, for example below 70 mv. and the centre tappings of the transformer windings should be within 5% of the centre of the windings so that the circuit can offer a wide range of control with negligible distortion. The impedance of the overall circuit can be increased and the diode resistance increased to compensate by reducing the bias current, but this results in a degree of non-linearity.

Figure 2:
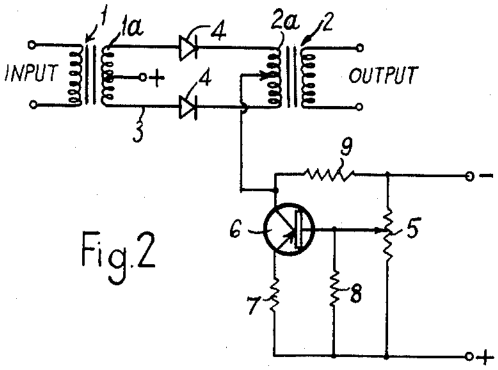
FIGURE 2 shows a circuit similar to FIGURE 1, but in which the control bias to the diode devices is applied through a transistor.

It is preferable that the source impedance of the control voltage should be very low, and this may be obtained by using the circuit shown in FIGURE 2. In this circuit the centre tap of the winding *1a* of transformer 1 is connected to the positive pole of the D.C. supply, which is a stabilised supply, whilst the centre tap of the winding *2a* of the transformer 2 is connected to the collector of a transistor 6, the base of which is connected to the slider of the potentiometer 5. The emitter and base of the transistor 6 are connected to the positive pole of the D.C. supply through resistances 7 and 8 respectively. The collector of the transistor is also connected through a resistance 9 to the end of the potentiometer 5 which is connected to the negative pole of the D.C. supply.

With this arrangement of bias, as the base of the transistor 6 is driven negative by adjusting the slider of the potentiometer 5, the collector current increases and the collector potential decreases. Thus the control bias current to the diodes 4 is reduced whereby the impedance of the diodes 4 increases, and therefore the attenuation of the signal is also increased. When the base of the transistor 6 is taken more positive, the reverse action takes place.

The circuits shown in FIGURES 1 and 2 may advantageously be used as faders, i.e. volume control arrangements, in equipment where a conventional potentiometer is not suitable because of signal/noise ratio requirements, frequency response, or merely because of the inaccessibility of a particular unit and the need to avoid lengthy connections carrying signal frequencies to a potentiometer. In the latter case the potentiometer 5, and possibly the power supply circuit including transistor 6 in FIGURE 2, is located at a point remote from the signal circuits through transformers 1 and 2.

Figure 3:
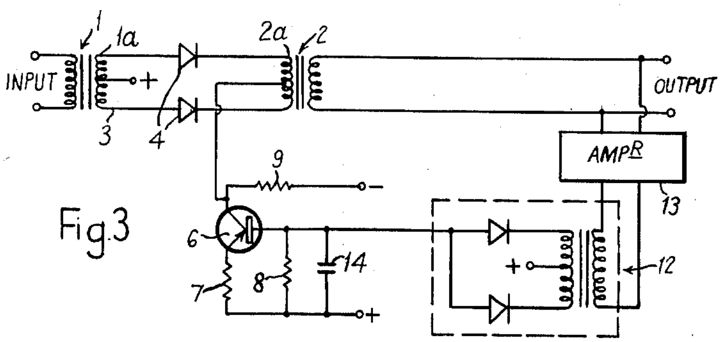
FIGURE 3 shows a circuit suitable for automatic amplitude control of an applied signal.

FIGURE 3 shows a circuit for the automatic amplitude control e.g. expansion or compression of a signal, which gives a wide range of control. It has been found difficult to achieve non-linear characteristics with conventional transistor circuits, but the circuit shown in FIG- URE 3 actually provides a wider range of control than could be obtained using any simple arrangement with variable-mu valves. In this embodiment, parts of which are similar to FIGURE 2, the base of the transistor 6 is not connected to a potentiometer, but is connected through a full wave rectifier circuit 12 to the output of an amplifier 13 which is in turn connected across the output of the transformer 2. The low voltage D.C. stabilised supply is connected across the collector and emitter of the transistor 6, as in FIGURE 2, and a capacitor 14 is connected between the base and the positive pole of the stabilised supply, to which the emitter is also connected. The compression or expansion range of the control circuit is dependent upon the gain of the amplifier 13, and the characteristic of the circuit may be varied by changing the value of the capacitor 14 to give a different time constant. The gain of amplifier 13 may of course be made to be adjustable so that the compression or expansion range can be altered.

Figure 4:
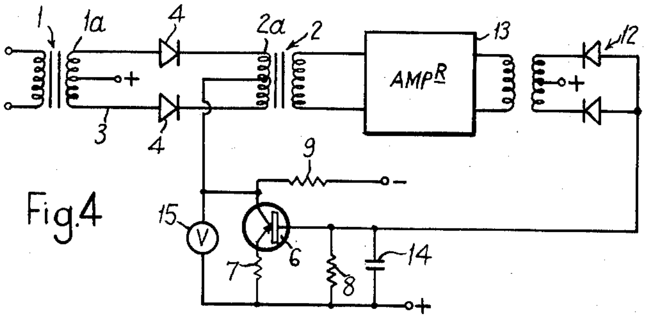
FIGURE 4 shows a circuit used for monitoring the level of an applied signal.

FIGURE 4 shows a circuit arrangement which uses the automatic attenuation control to operate a peak programme meter or logarithmic meter, such as is used for monitoring signal levels in broadcasting stations. These meters are peak reading devices having a sharp attack time and a slow decay time, and preferably give a linear indication for logarithmic changes in the input. The circuit shown is generally similar to that shown in FIGURE 3 in that the base of the transistor 6 is connected through a full wave signal rectifier circuit 12 to an amplifier which is connected across the output of the transformer 2. In this case however a high impedance voltmeter 15 is connected between the collector of the transistor 6 and the positive pole of the stabilised D.C. supply. This circuit acts as an automatic compressor and the meter 15 indicates the degree of compression. The meter is constructed so that the pointer is at rest at the right-hand end of the scale, which itself has its zero reading at the left-hand end. The diodes 4 are biased to be fully conducting with zero input signal in which condition there is maximum voltage across the transistor 6 and the meter 15 will show zero signal level on the scale. As the signal level increases the rectified signal voltage increases and tends to bias off the diodes. At the same time the voltage across the transistor 6 and hence across the meter 15 is reduced, which thus gives a reading of the increased signal level.

The circuit according to the present invention may be used in studio equipment for the control or inspection of both video and audio signal amplitudes and is applicable to wide band and D.C. amplifiers up to relatively high frequencies.

Whilst particular embodiments have been described it will be understood that various modifications may be made without departing from the scope of this invention. Thus the diode devices may be connected with reverse polarity to that shown.

We claim:

1. A circuit arrangement for controlling the amplitude of a signal fed over a pair of conductors comprising, a separate diode device connected in series with each conductor, a low impedance bias source for biasing said diode devices so that they conduct when no signal is applied thereto and means for automatically varying the bias applied to both diode devices in accordance with variations in amplitude of the applied signal so as to alter their conductance without causing them either to cut-off or saturate and hence altering their impedance to said signal fed over the conductors through the diode devices and said circuit presenting a small D.C. resistance and a small A.C. impedance to said diode devices whereby the change in impedance of said diode devices is effective on said signal.

2. A circuit arrangement as claimed in claim 1, in which the signal passed by the diode devices is rectified and controls the bias applied to said diode devices.

3. A circuit arrangement for controlling the amplitude of a signal fed over a pair of conductors comprising, a separate diode device connected in series with each conductor, a low impedance bias source for biasing said diode devices so that they conduct when no signal is applied thereto and means for varying the bias applied to both diode devices so as to alter their conductance without causing them either to cut-off or saturate and hence altering their impedance to a signal fed over the conductors through the diode devices and said circuit presenting a small D.C. resistance and a small A.C. impedance to said diode devices whereby the change in impedance of said diode devices is effective on said signal, and said low impedance bias source comprising a transistor having its emitter connected through a load to one pole of a D.C. supply and its collector connected through a further load to the other pole of said D.C. supply, means for feeding the base of said transistor with a D.C. voltage derived from the output signal passed by the diode devices and a connection for feeding the bias to said diode devices from the collector of said transistor.

4. A circuit arrangement as claimed in claim 3, more particularly for operation as a peak programme meter or logarithmic meter, wherein a voltmeter is connected across the transistor to indicate changes in the signal amplitude.

5. A circuit arrangement for controlling the amplitude of an audio frequency or video frequency signal fed over a pair of conductors comprising a separate diode device connected in series with each of said conductors, a transformer having a centre-tapped secondary winding the opposite ends of which are connected through conductors to the input electrodes of said diode devices, a further transformer having a centre-tapped primary winding the opposite ends of which are respectively connected through conductors to the output electrodes of said diode devices, means for applying a D.C. potential to the centre tap of the secondary winding of said first transformer, means for applying an adjustable bias to the centre tap of the primary winding of said second transformer so that when no signal is applied to said diode devices through said first transfomer said diode devices are in a conducting state and means for varying the bias applied to said diode devices through the primary of said second transformer so as to alter their conductance without causing them either to cut-off or saturate and hence altering their impedance to a signal fed thereto, said bias being derived from a low impedance circuit including a transistor having its emitter connected through a load to one pole of a stabilised D.C. supply and its collector connected through a load to the other pole of said D.C. supply, the collector of said transistor also being connected to the centre tap of the primary winding of said second transformer and means comprising a rectifier circuit producing a rectified voltage from the signal passed by said diode devices for applying a variable voltage to the base of said transistor and said circuit presenting a small D.C. resistance and a small A.C. impedance to said diode devices whereby the change in impedance of said diode devices is effective on said signal.

6. A circuit arrangement operating as a peak programme meter for indicating the amplitude of an audio frequency or video frequency signal fed over a pair of conductors comprising a separate diode device connected in series with each of said conductors, a transformer having a centre-tapped secondary winding the opposite ends of which are connected through conductors to the input electrodes of said diode devices, a further transformer having a centre-tapped primary winding the opposite ends of which are respectively connected through conductors to the output electrodes of said diode devices, means for applying a D.C. potential to the centre tap of the secondary winding of said first transformer, means for applying an adjustable bias to the centre tap of the primary winding of said second transformer so that when no signal is applied to said diode devices through said first transformer said diode devices are in a conducting state and means for varying the bias applied to said diode devices through the primary of said second transformer so as to alter their conductance without causing them either to cut-off or saturate and hence altering their impedance to a signal fed thereto, said bias being derived from a low impedance circuit including a transistor having its emitter connected through a load to one pole of a stabilised D.C. supply and its collector connected through a load to the other pole of said D.C. supply, the collector of said transistor also being connected to the centre tap of the primary winding of said second transformer and means comprising a rectifier circuit producing a rectified voltage from the signal passed by said diode devices for applying a variable voltage to the base of said transistor and a voltmeter connected between the collector of said transistor and the pole of said stabilised D.C. supply to which said emitter is connected and said circuit presenting a small D.C. resistance and a small A.C. impedance to said diode devices whereby the change in impedance of said diode devices is effective on said signal.

References Cited by the Examiner

UNITED STATES PATENTS

| | | | |
|---|---|---|---|
| 2,248,267 | 7/41 | Bacon | 328—171 |
| 2,313,583 | 3/43 | Ressler | 332—52 |
| 2,338,412 | 1/44 | Dallos | 328—171 |
| 2,910,550 | 10/59 | Soffel | 330—140 |
| 3,093,802 | 6/63 | Chow | 330—145 |

WALTER L. CARLSON, *Primary Examiner.*

RUDOLPH V. ROLINEC, FREDERICK M. STRADER, *Examiners.*